United States Patent
Goodnow et al.

(10) Patent No.: US 7,353,486 B2
(45) Date of Patent: *Apr. 1, 2008

(54) DATA PROCESSING IN DIGITAL SYSTEMS

(75) Inventors: Kenneth J. Goodnow, Essex, VT (US); Clarence R. Ogilvie, Huntington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 173 days.

This patent is subject to a terminal disclaimer.

(21) Appl. No.: 11/272,884

(22) Filed: Nov. 14, 2005

(65) Prior Publication Data

US 2006/0070016 A1 Mar. 30, 2006

Related U.S. Application Data

(62) Division of application No. 10/729,750, filed on Dec. 4, 2003, now Pat. No. 6,996,795.

(51) Int. Cl.
*G06F 17/50* (2006.01)
(52) U.S. Cl. ......................................... 716/16; 716/17
(58) Field of Classification Search ............. 716/15–17
See application file for complete search history.

(56) References Cited

U.S. PATENT DOCUMENTS

| | | | |
|---|---|---|---|
| 5,654,650 A | 8/1997 | Gissel | |
| 5,828,858 A | 10/1998 | Athanas et al. | |
| 5,892,961 A | 4/1999 | Trimberger | |
| 6,011,406 A | 1/2000 | Veenstra | |
| 6,205,574 B1 | 3/2001 | Dellinger et al. | |
| 6,215,327 B1 | 4/2001 | Lyke | |
| 6,282,627 B1 | 8/2001 | Wong et al. | |
| 6,346,824 B1 | 2/2002 | New | |
| 6,349,346 B1 | 2/2002 | Hanrahan et al. | |
| 6,408,422 B1 | 6/2002 | Hwang et al. | |
| 6,530,070 B2 * | 3/2003 | Kruse ........................... | 716/16 |
| 6,577,158 B2 | 6/2003 | Gupta | |
| 6,624,654 B1 | 9/2003 | Trimberger | |
| 6,629,308 B1 * | 9/2003 | Baxter ......................... | 716/16 |
| 6,772,405 B1 | 8/2004 | Gan et al. | |
| 6,836,842 B1 * | 12/2004 | Guccione et al. ........... | 713/100 |
| 6,996,795 B2 * | 2/2006 | Goodnow et al. ............. | 716/12 |
| 2003/0119555 A1 | 6/2003 | Friesen et al. | |
| 2003/0128050 A1 | 7/2003 | Schultz | |

\* cited by examiner

*Primary Examiner*—Jack Chiang
*Assistant Examiner*—Binh Tat
(74) *Attorney, Agent, or Firm*—Schmeiser, Olsen & Watts; William H. Steinberg

(57) ABSTRACT

A structure comprising an FPGA (Field-Programmable Gate Array) for relieving bottlenecks, and a method for operating the structure. The FPGA comprises multiple FPGA elements each of which includes a CLB (Configurable Logic Block), an instruction queue, and a data buffer. One functional block after another (separate from one another) can be formed in the FPGA via a first local IO (Input/Output) circuit and moved to a second local IO circuit. Within each functional block, a mapped logic location function calculates the direction, distance, and the time for the step from the current location of the functional block stored in a mapped location register, and the destination stored in a mapped destination register, and the time allowed for the movement, and stores the direction and distance of the step in the mapped movement register. Then, the functional block moves according the direction and distance stored in the mapped movement register.

8 Claims, 3 Drawing Sheets

DATA PROCESSING IN DIGITAL SYSTEMS

This application is a divisional of Ser. No. 10/729,750, filed on Dec. 4, 2003 now U.S. Pat. No. 6,996,795.

BACKGROUND OF THE INVENTION

1. Technical Field

The present invention relates to data processing, and more specifically, to data processing in a digital system.

2. Related Art

In a typical system where instructions are executed against data, there are usually bottlenecks that limit throughput of the system. These bottlenecks include fixed buses and wires that move data and instructions across the system to a fixed location where an execution unit resides. These bottlenecks require a lot of wires and buffers and, therefore, are not desirable in terms of performance and power consumption.

Therefore, a design of a novel system is needed that does not have bottlenecks for data processing. A method is also needed for operating the novel system.

SUMMARY OF THE INVENTION

The present invention provides a structure comprising an FPGA (Field-Programmable Gate Array) including a plurality of FPGA elements, each of the FPGA elements comprising an FPGA CLB (Configurable Logic Block), wherein each FPGA element in the FPGA is assigned an address and is configured to provide its address, wherein a first subset of the FPGA elements is configured to form a first functional block, wherein the first functional block comprises a mapped location register residing in one or more FPGA CLBs of the first functional block, and wherein the mapped location register is configured to receive and store the address of a current location FPGA element, the current location FPGA element being in the first functional block and the address of the current location FPGA element being specified as the location of the first functional block.

The present invention also provides a method for operating an FPGA, the method comprising the steps of (a) providing an FPGA including a plurality of FPGA elements, each of the FPGA elements comprising an FPGA CLB wherein each FPGA element in the FPGA is assigned an address and is configured to provide its address; (b) forming a first functional block on a first subset of the FPGA elements; (c) providing in the first functional block a mapped location register residing in one or more FPGA CLBs of the first functional block; and (d) using the mapped location register to receive and store the address of a current location FPGA element, the current location FPGA element being in the first functional block and the address of the current location FPGA element being specified as the location of the first functional block.

The present invention also provides a method for operating an FPGA, the method comprising the steps of (a) providing a plurality of FPGA elements, each of the plurality of FPGA elements comprising an FPGA CLB and being assigned an address; (b) forming a first functional block comprising one or more FPGA elements of the plurality of FPGA elements; (c) moving the first functional block to a destination in the FPGA; and (d) forming a second functional block comprising at least one FPGA element of the plurality of FPGA elements, the second functional block being separate from the first functional block at any time.

The present invention provides a novel structure for relieving bottlenecks for data processing.

The present invention also provides methods for operating the novel structure.

DETAILED DESCRIPTION OF THE INVENTION

The invention uses an FPGA (Field-Programmable Gate Array) to move instructions and associated data across the system to locations that handle execution. As a result, the system is relieved from bottlenecks. More explanations are presented infra.

Figure 1:
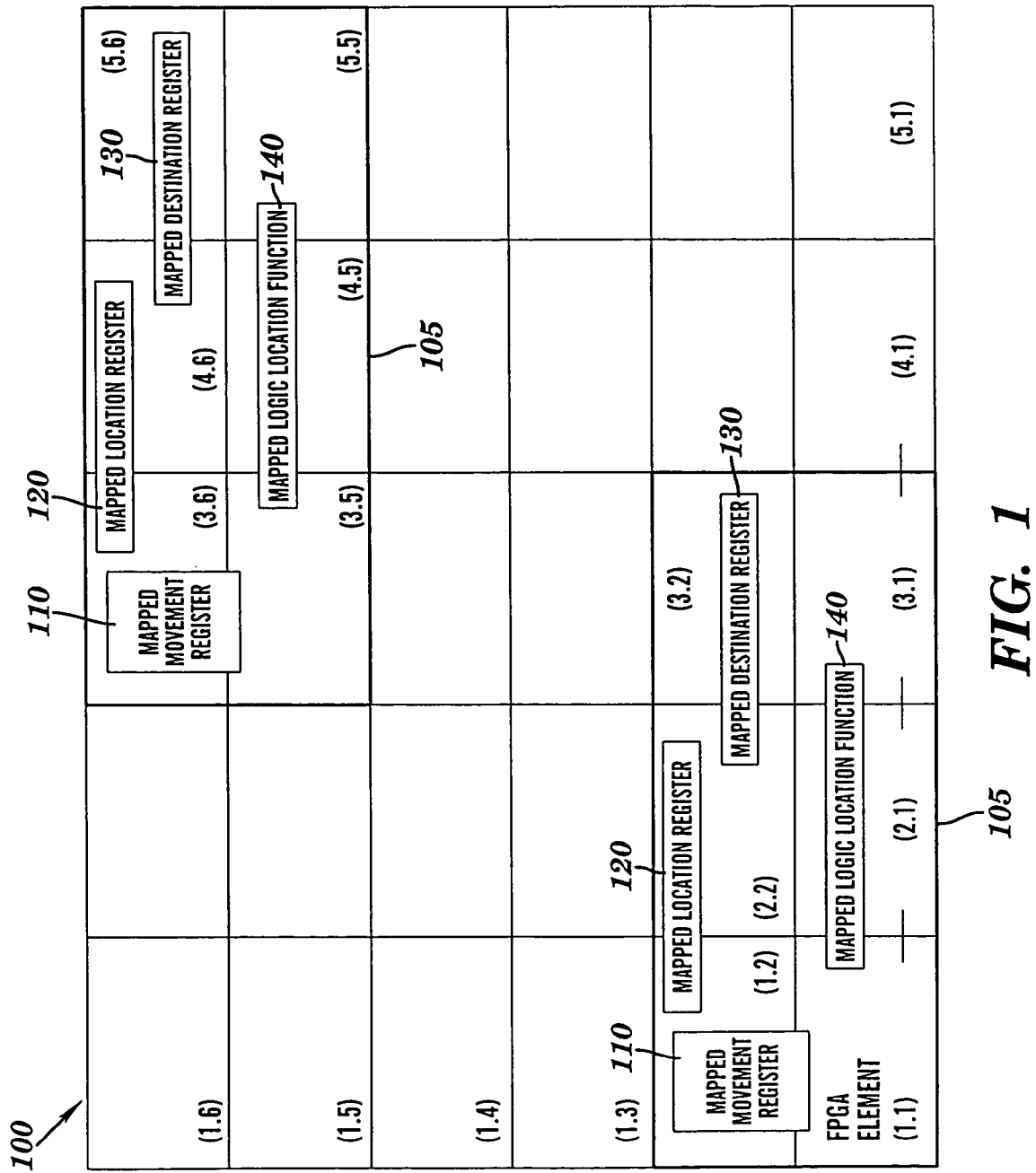
FIG. 1 illustrates an FPGA (Field-Programmable Gate Array) comprising multiple FPGA elements, in accordance with embodiments of the present invention.

FIG. 1 illustrates an FPGA 100, in accordance with embodiments of the present invention. Illustratively, the FPGA 100 comprises 30 FPGA elements 1.1, 1.2, . . . , and 5.6, arranged in six rows and five columns. In one embodiment, each FPGA elements 1.1, 1.2, . . . , and 5.6 has an assigned and hardwired address.

Figure 2:
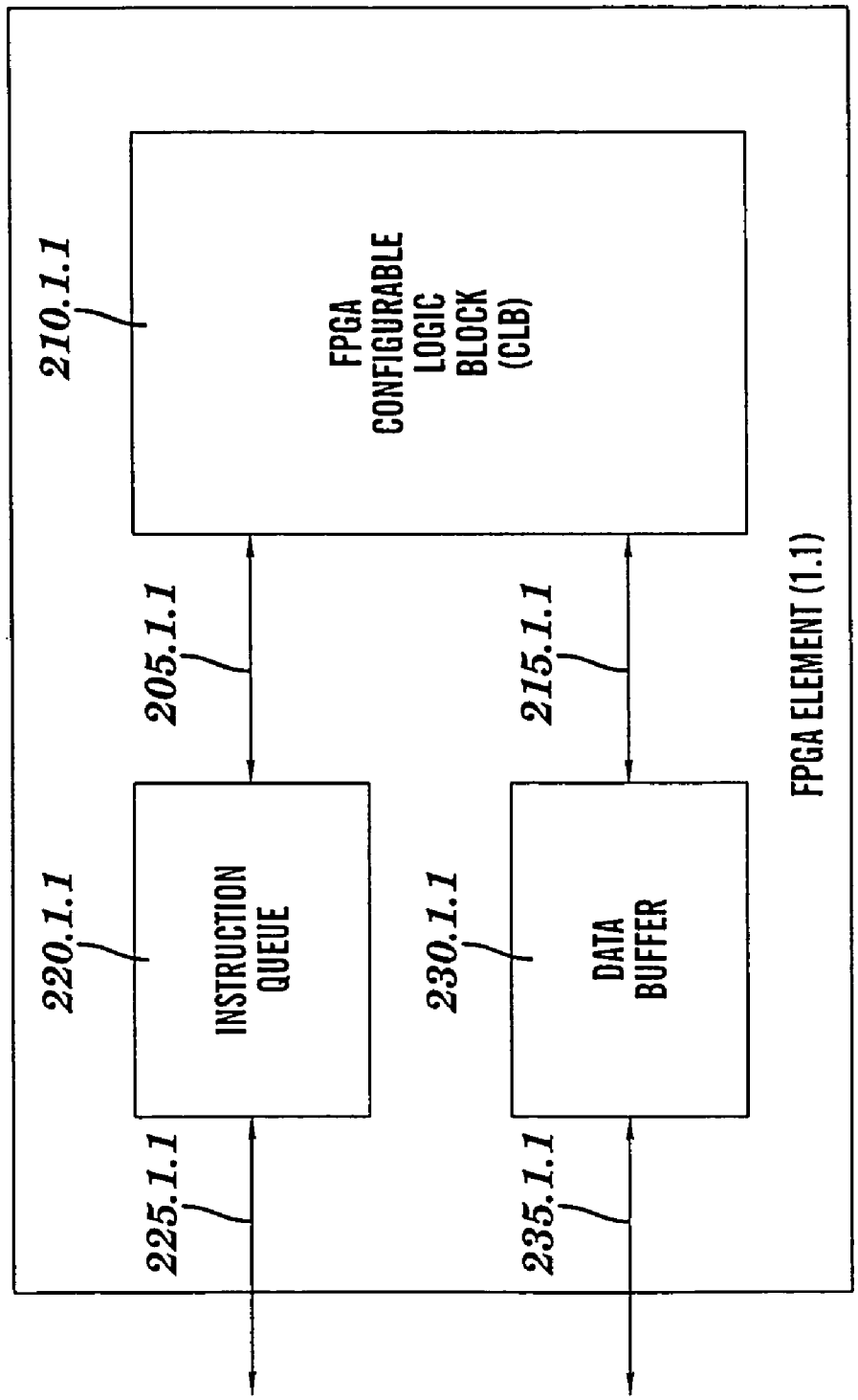
FIG. 2 illustrates an FPGA element of the FPGA of FIG. 1, in accordance with embodiments of the present invention.

FIG. 2 illustrates the FPGA element 1.1 of the FPGA 100 of FIG. 1, in accordance with embodiments of the present invention. Illustratively, the FPGA element 1.1 comprises an FPGA CLB (Configurable Logic Block) 210.1.1, an instruction queue 220.1.1, and a data buffer 230.1.1.

The FPGA CLB 210.1.1 is electrically coupled to the instruction queue 220.1.1 and the data buffer 230.1.1 via connections 205.1.1 and 215.1.1, respectively. The instruction queue 220.1.1 and the data buffer 230.1.1 are electrically coupled to the rest of the FPGA 100 (FIG. 1) via connection 225.1.1 and 235.1.1, respectively (more explanations are presented infra).

The other FPGA elements of the FPGA 100 have a structure similar to that of the FPGA element 1.1. For instance, the FPGA element 1.2 may comprise an FPGA CLB 210.1.2, an instruction queue 220.1.2, and a data buffer 230.1.2 (not shown), and so on.

The operation of the FPGA 100 can be illustrated in the following example with reference to both FIGS. 1 and 2. For the example, assume that a functional block 105 comprising six FPGA elements 1.1, 1.2, 2.1, 2.2, 3.1, and 3.2 is formed at the bottom left region of the FPGA 100 with associated data. In one embodiment, the functional block 105 is formed by first loading configuration bits (i.e., instructions) into the six instruction queues 220 of the six FPGA elements 1.1, 1.2, 2.1, 2.2, 3.1, and 3.2. Then, the associated data is loaded into the six data buffers 230 of the six FPGA elements 1.1, 1.2, 2.1, 2.2, 3.1, and 3.2. As a result, the six CLBs 210 of the six FPGA elements 1.1, 1.2, 2.1, 2.2, 3.1, and 3.2 are configured to process the associated data. However, at this time, the results of data processing are temporarily stored within the functional block 105.

Also, each of the six FPGA elements 1.1, 1.2, 2.1, 2.2, 3.1, and 3.2 of the functional block 105 is assigned a unique function number. Assume for this example that the unique function number is 95$d$ ("d" indicates decimal).

In one embodiment, the functional block 105 comprises a mapped movement register 110, a mapped location register 120, a mapped destination register 130, and a mapped logic location function 140. Each of the mapped movement register 110, the mapped location register 120, and the mapped destination register 130 comprises one or more latches residing in the CLBs 210 of the functional block 105 (i.e., in the six FPGA elements 1.1, 1.2, 2.1, 2.2, 3.1, and 3.2). The mapped logic location function 140 may comprise different elements (latches, logic gates, buffers, wires, . . . ) of the six FPGA elements 1.1, 1.2, 2.1, 2.2, 3.1, and 3.2.

In one embodiment, the mapped movement register 110 is configured to receive and store the direction and distance whereby the functional block 105 will move. The mapped location register 120 is configured to receive and store the address of the current location of the functional block 105. The mapped destination register 130 is configured to receive and store the address of the destination of the functional block 105. The mapped logic location function 140 controls the movement of the functional block 105.

In one embodiment, the mapped movement register 110 comprises multiple latches residing in the CLBs 210.1.1 and 210.1.2 of the FPGA elements 1.1 and 1.2, respectively. The mapped location register 120 comprises multiple latches residing in the CLBs 210.1.2 and 210.2.2 of the FPGA elements 1.2 and 2.2, respectively. The mapped destination register 130 comprises multiple latches residing in the CLBs 210.2.2 and 210.3.2 of the FPGA elements 2.2 and 3.2, respectively. The mapped logic location function 140 comprises different elements (latches, logic gates, buffers, wires, . . . ) of the CLBs 210.1.1, 210.2.1, and 210.3.1 of the FPGA elements 1.1, 2.1, and 3.1, respectively.

For the current example, assume the current location of the functional block 105 is the location of its top-right FPGA element 3.2. As a result, in one embodiment, the address of the FPGA element 3.2 is latched into the mapped location register 120. In one embodiment, each CLB 210 is capable of retrieving and providing its own assigned address so that the functional block 105 knows where it currently is.

Assume further that the destination of the functional block 105 is the location of the FPGA element 5.6. As a result, the address of the FPGA element 5.6 is latched into the mapped destination register 130. Also, the time (in terms of clock cycles) allowed for the functional block 105 to move from the location of the FPGA element 3.2 to the location of the FPGA element 5.6 is also latched into the mapped logic location function 140.

In one embodiment, based on the current location stored in the mapped location register 120, the destination stored in the mapped destination register 130, and the time allowed for moving from current location to the destination, the mapped logic location function 140 calculates the direction, the distance, and the time of the next step (the move from current location to destination may comprise one or more steps).

For the example, assume that the time allowed for the move is 250$d$ clock cycles. Then, based on the current location of (3.2) stored in the mapped location register 120, the destination of (5.6) stored in the mapped destination register 130, and the time allowed for moving from current location to the destination (250$d$ clock cycles), the mapped logic location function 140 may decide that the next step of the move will be to move up one row at clock cycle 20$d$. As a result, the mapped logic location function 140 puts in the mapped movement register 110 the direction (up) and the distance (one row) of the next step, and then issues a broadcast command to the entire FPGA 100 commanding all FPGA elements having function number 95$d$ to move in the direction and with the distance specified in the mapped movement register 110. In response, all six FPGA elements 1.1, 1.2, 2.1, 2.2, 3.1, and 3.2, having the same function number 95$d$, move up one row at clock cycle 20$d$. More specifically, for the FPGA element 1.2, the contents and configurations of the FPGA CLB 210.1.2, the instruction queue 220.1.2, and the data buffer 230.1.2 are transferred up one row to the FPGA element 1.3.

The remaining FPGA elements of the functional block 105 also move up one row in a similar manner. As a result, after this first step, the functional block 105 comprises six FPGA elements 1.2, 1.3, 2.2, 2.3, 3.2, and 3.3. The mapped movement register 110, the mapped location register 120, the mapped destination register 130, and the mapped logic location function 140 also move with the functional block 105 with their relative positions unchanged.

After one or more steps similar to the first step described above, the functional block 105 reaches its final destination as specified in the mapped destination register 130, within the time allowed of 250$d$ clock cycles, as shown at top right of FIG. 1. Then, the results of data processing are outputted from the functional block 105. After that, the functional block 105 is terminated so that the six FPGA elements 3.5, 3.6, 4.5, 4.6, 5.5, and 5.6 can be used for one or more other functional blocks.

After the first step of the move of the functional block 105, the FPGA elements 1.1, 2.1, and 3.1 are free for use by one or more other functional blocks (if any). In the embodiments described above, functional block 105 has a rectangular shape. In general, a functional block can have any shape. Also, the positions of the mapped movement register, the mapped location register, the mapped destination register, and the mapped logic location function of a functional block can be arbitrary inside the functional block 105, but their relative positions are unchanged when the functional block 105 moves.

Continuing the example above, assume after the functional block 105 leaves the bottom left region for the destination at top right of the FPGA 100 that there is enough space (i.e., free FPGA elements) for a second functional block (not shown) at the bottom left region of the FPGA 100. Then, the second functional block with associated data can be formed there. The second functional block also comprises a mapped movement register, a mapped location register, a mapped destination register, and a mapped logic location function (not shown) of its own. The mapped movement register, the mapped location register, the mapped destination register, and the mapped logic location function of the second functional block can reside in any one or more FPGA elements of the second functional block. Also, each FPGA element of the second functional block is assigned a unique function number (which is different from the function number of the first functional block 105 described above). A move time limit is also assigned to the second functional block. The destination of the second functional block may be the same as or different from the destination of the first functional block 105.

Figure 3:
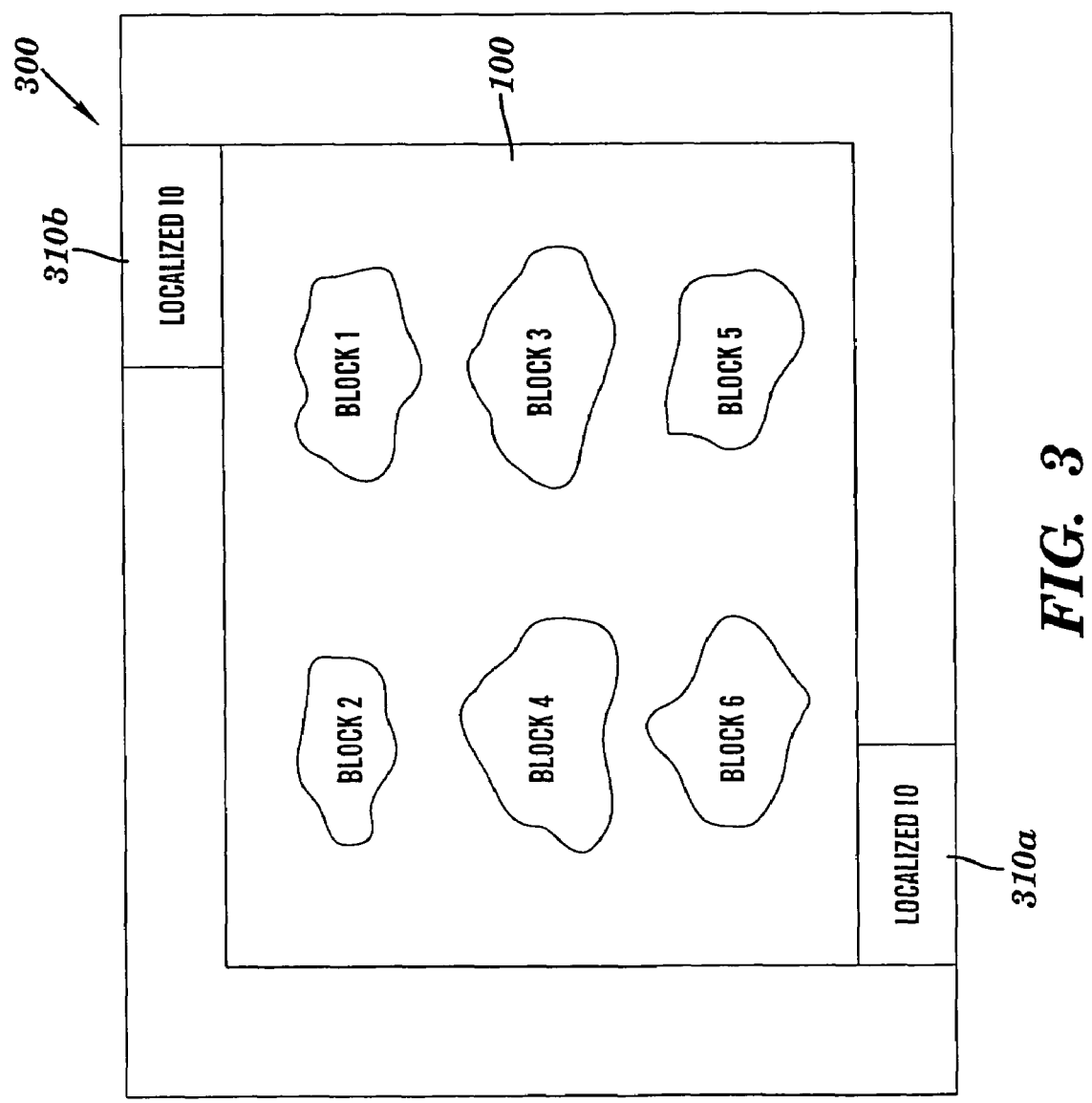
FIG. 3 illustrates a snapshot of a structure comprising the FPGA of FIG. 1 being operated in accordance with embodiments of the present invention.

FIG. 3 illustrates a snapshot of a structure 300 comprising the FPGA 100 of FIG. 1 being operated in accordance with embodiments of the present invention. Illustratively, the structure 300 comprises the FPGA 100 and two localized IO (Input/Output) circuits 310$a$ and 310$b$.

The snapshot illustrates six different functional blocks 1-6 occupying six separate regions of the FPGA 100. Each of the six functional blocks 1-6 is formed via the localized IO 310$a$ (at bottom left of FPGA 100) with the same destination at the localized IO 310b (at top right of FPGA 100). Block 1 is formed first, therefore it is closest to the destination (i.e., the localized IO 310b). Block 6 is formed last, therefore it is closest to the start point (i.e., localized IO 310a).

When each of the six functional blocks 1-6 in turn reaches the destination, it can generate outputs via the localized IO 310b and is terminated so that the other functional blocks (if any) can approach the same destination (i.e., the localized IO 310b).

In summary, the FPGA 100 plays the role of a buffer that accepts all instructions and associated data (in form of functional blocks). The functional blocks then moves on their own from the localized IO 310a to the localized IO 310b without creating a bottleneck at either of the localized IOs 310a and 310b. Alternatively, the movement of the functional blocks may be controlled from a centralized controller (not shown) built in the fabric of the FPGA 100.

In the embodiments described above, the FPGA 100 has six rows and five columns. In general, the FPGA 100 can have any number of rows and columns. Also, the FPGA 100 can have any shape besides rectangle and can have any number of FPGA elements.

In one embodiment, the formation of a functional block in the FPGA 100 can be done by loading the configuration bits and associated data in series into the FPGA 100. Alternatively, the loading can be done in parallel requiring more wires connecting to each FPGA elements of the functional block.

Similarly, the transfer of the contents of one FPGA element to another can be done in series. If so, the functional block can only move one row or one column at a time (i.e., in one cycle). In one embodiment, the FPGA 100 has connections electrically coupling adjacent FPGA elements so that the contents of all FPGA elements in a functional block can be transferred to their adjacent FPGA elements in one clock cycle. In the example above, when the functional block 105 moves from bottom left of the FPGA 100 up one row, the contents of the FPGA elements 1.1 and 1.2 are moved up one row in one cycle (simultaneously) to the FPGA elements 1.2 and 1.3, respectively. In the same cycle, the contents of the FPGA elements 2.1 and 2.2 are moved up one row to the FPGA elements 2.2 and 2.3, respectively. Also, in the same cycle, the contents of the FPGA elements 3.1 and 3.2 are moved up one row to the FPGA elements 3.2 and 3.3, respectively.

In one embodiment, the transfer of the contents of one FPGA element to another can be done in parallel. If so, the functional block can move multiple rows or columns at a time (i.e., in one cycle). In one embodiment, the FPGA 100 has connections electrically coupling each FPGA element to surrounding FPGA elements such that the contents of all FPGA elements in a functional block can be transferred to their non-adjacent FPGA elements in one clock cycle. For instance, if the functional block 105 is to jump from bottom left region of FPGA 100 to the final destination in one clock cycle, there must be connections (wires) connecting the FPGA element 1.1 to the FPGA element 3.5. Similarly, there must be connections (wires) connecting the FPGA elements 1.2, 2.1, 2.2, 3.1, and 3.2 to the FPGA element 3.6, 4.5, 4.6, 5.5, and 5.6, respectively.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A structure, comprising:
an FPGA (Field-Programmable Gate Array) including a plurality of FPGA elements, each of the FPGA elements comprising an FPGA CLB (Configurable Logic Block),
wherein each FPGA element in the FPGA is assigned an address and is configured to provide its address,
wherein a first subset of the FPGA elements is configured to form a first functional block,
wherein the first functional block comprises a mapped location register residing in one or more FPGA CLBs of the first functional block, and
wherein the mapped location register stores the address of a current location FPGA element, the current location FPGA element being in the first functional block and the address of the current location FPGA element being specified as the location of the first functional block
a first localized IO (Input/Output) circuit and a second localized IO circuit both electrically coupled to the FPGA,
wherein the first functional block is formed via the first localized IO circuit,
wherein the first functional block is configured to move to the second localized IO circuit,
wherein a second subset of the FPGA elements are configured to form a second functional block separate from the first functional block at any time,
wherein the second functional block is formed via the first localized IO circuit, and
wherein the second functional block is configured to move to the second localized IO circuit.

2. The structure of claim 1,
wherein the first functional block further comprises a mapped destination register residing in one or more FPGA CLBs of the first functional block, and
wherein the mapped destination register stores the address of a destination FPGA element, the address of the destination FPGA element being specified as the destination of the first functional block.

3. The structure of claim 1, wherein the first functional block is configured to move to the second localized IO circuit within a time limit in terms of clock cycles.

4. The structure of claim 1, wherein the FPGA further comprises connections electrically coupling each FPGA element to surrounding FPGA elements such that the contents of all FPGA elements in a functional block can be transferred to their non-adjacent FPGA elements in one clock cycle.

5. A method for operating an FPGA, the method comprising the steps of:
providing an FPGA including a plurality of FPGA elements, each of the FPGA elements comprising an FPGA CLB wherein each FPGA element in the FPGA is assigned an address and is configured to provide its address;
forming a first functional block on a first subset of the FPGA elements;
providing in the first functional block a mapped location register residing in one or more FPGA CLBs of the first functional block; and
using the mapped location register to receive and store the address of a current location FPGA element, the current location FPGA element being in the first functional block and the address of the current location FPGA element being specified as the location of the first functional block wherein said forming the first functional block on the first subset of the FPGA elements comprises:

providing a first localized IO (Input/Output) circuit and a second localized IO circuit, both electrically coupled to the FPGA; and forming the first functional block via the first localized IO circuit;

forming a second functional block on a second subset of the FPGA elements and via the first localized IO circuit, the second functional block being separate from the first functional block at any time; and moving the second functional block to the second localized IO circuit within a time limit in terms of clock cycles.

6. The method of claim 5, further comprising the steps of:

providing further in the first functional block a mapped destination register residing in one or more FPGA CLBs of the first functional block; and using the mapped destination register to receive and store the address of a destination FPGA element, the address of the destination FPGA element being specified as the destination of the first functional block.

7. The method of claim 5, further comprising the step of moving the first functional block to the second localized IO circuit within a time limit in terms of clock cycles.

8. The method of claim 5, further comprising the step of providing connections electrically coupling each FPGA element to surrounding FPGA elements such that the contents of all FPGA elements in a functional block can be transferred to their non-adjacent FPGA elements in one clock cycle.

* * * * *